United States Patent
Seo et al.

(10) Patent No.: US 9,641,148 B2
(45) Date of Patent: *May 2, 2017

(54) RESONATOR AND FILTER HAVING THE SAME

(71) Applicant: Innertron, Inc., Incheon (KR)

(72) Inventors: Soo Duk Seo, Incheon (KR); Hak Rae Cho, Incheon (KR)

(73) Assignee: INNERTRON, INC., Incheon (KR)

(*) Notice: Subject to any disclaimer, the term of this patent is extended or adjusted under 35 U.S.C. 154(b) by 114 days.

This patent is subject to a terminal disclaimer.

(21) Appl. No.: 14/539,097

(22) Filed: Nov. 12, 2014

(65) Prior Publication Data

US 2015/0280681 A1    Oct. 1, 2015

(30) Foreign Application Priority Data

Mar. 28, 2014  (KR) ........................ 10-2014-0037104

(51) Int. Cl.
| | |
|---|---|
| H01P 1/202 | (2006.01) |
| H03H 7/01 | (2006.01) |
| H01P 1/205 | (2006.01) |
| H01P 1/208 | (2006.01) |
| H01P 7/04 | (2006.01) |
| H01P 7/10 | (2006.01) |

(52) U.S. Cl.
CPC ......... H03H 7/0161 (2013.01); H01P 1/2053 (2013.01); H01P 1/2084 (2013.01); H01P 7/04 (2013.01); H01P 7/10 (2013.01)

(58) Field of Classification Search
CPC .. H01P 7/10; H01P 1/202; H01P 1/201; H01P 1/2056

USPC ............ 333/202, 206, 207, 222, 223, 219.1
See application file for complete search history.

(56) References Cited

U.S. PATENT DOCUMENTS

| | | | |
|---|---|---|---|
| 4,342,972 A | 8/1982 | Nishikawa et al. | |
| 6,020,800 A | 2/2000 | Arakawa et al. | |
| 6,026,281 A | 2/2000 | Yorita | |
| 6,515,559 B1* | 2/2003 | Yamakawa | H01P 1/2053 333/202 |
| 8,286,327 B2* | 10/2012 | Jung | H01P 1/2053 29/592.1 |
| 2002/0041221 A1 | 4/2002 | Abdulnour | |
| 2003/0164746 A1* | 9/2003 | Kido | C04B 35/462 333/219 |

(Continued)

FOREIGN PATENT DOCUMENTS

| | | | |
|---|---|---|---|
| CN | 101895004 | 11/2010 | |
| JP | 62123801 | * 6/1987 | H01P 1/205 |

(Continued)

OTHER PUBLICATIONS

Machine English language translation of Eguchi et al (JP62-123801), "Coaxial Filter," Jun. 5, 1987.*

(Continued)

*Primary Examiner* — Stephen E Jones
(74) *Attorney, Agent, or Firm* — Cantor Colburn LLP

(57) ABSTRACT

A resonator and a filter including the same are provided. The resonator includes a body formed of a dielectric material and including a through-hole formed in one direction, and a conductive film coupled to at least one of both side cross-sections of the body in a lengthwise direction and a wall surface of the through-hole.

11 Claims, 5 Drawing Sheets

(56) References Cited

U.S. PATENT DOCUMENTS

| | | | | |
|---|---|---|---|---|
| 2004/0036557 A1* | 2/2004 | Yamakawa | ............... | H01P 7/10 |
| | | | | 333/202 |
| 2004/0145432 A1 | 7/2004 | Yamakawa et al. | | |
| 2006/0238275 A1* | 10/2006 | Burger | ................. | H01P 11/007 |
| | | | | 333/202 |
| 2013/0249651 A1 | 9/2013 | Wu et al. | | |

FOREIGN PATENT DOCUMENTS

| | | |
|---|---|---|
| JP | 2013009092 | 1/2013 |
| KR | 1020090068511 | 6/2009 |

OTHER PUBLICATIONS

European Search Report—European Application No. 14182148.8, issued on Jul. 15, 2015, citing US 2002/041221, US 2004/145432, US 4 342 972, US 6 026 281, CN 101 895 004 and US 2013/249651.
Korean Office Action—Korean Application No. 10-2014-0037104 issued on Jun. 29, 2015, citing JP 2013-009092.
Chuma, et al., Compact Dielectric Loaded Combline Filter with Low Insertion-loss, 30th European Microwave conference Proceedings, 2000, pp. 316-319.
European Office Action—European Application No. 14 182 148.8 issued on Aug. 18, 2016, citing US 6 020 800 and Chuma, et al.

* cited by examiner

RESONATOR AND FILTER HAVING THE SAME

BACKGROUND

1. Technical Field

This invention relates to a resonator and a filter including the same.

2. Description of the Related Art

With advancement in wireless communication technology, various wireless communication systems using a frequency band of microwaves or millimeter waves as carrier waves have been developed. Also, data can be easily transmitted or received in various indoor/outdoor places using the various wireless communication systems.

Various radio-frequency (RF) filters are applied to communication devices used in a communication system. The RF filters are devices that pass only signals of a predetermined frequency band, and are classified into a low-pass filter (LPF), a band-pass filter (BPF), a high-pass filter (HPF), a band stop filter (BSF), etc. according to a frequency band to be filtered.

Recently, as mobile communications have been developed, high-frequency bands have been frequently used and resonators capable of achieving both narrow-band characteristics and high blocking characteristics are required. The existing resonators are disadvantageous in that a stop-band is very narrow and an undesired pass band periodically occurs.

Patent Document

Korean laid-open patent publication No. 2009-0068511

SUMMARY

One or more aspects of the present invention provide a resonator configured to improve attenuation characteristics and band stop characteristics, and a filter including the resonator.

According to one aspect of the present invention, a resonator includes a body formed of a dielectric material and including a through-hole formed in one direction, and a conductive film coupled to at least one of both cross-sections of the body in a lengthwise direction and a wall surface of the through-hole.

Here, the body may be formed of ceramic.

Both the cross-sections of the body in the lengthwise direction and the wall surface of the through-hole may be plated with the conductive film.

According to another aspect of the present invention, a filter includes a substrate configured to perform a grounding operation, a resonator coupled to the substrate, and including a conductive film coupled to at least one of lengthwise direction cross-sections of a body having a through-hole formed in one direction and a wall surface of the through-hole; and a housing coupled to the substrate to accommodate the resonator in a cavity thereof partitioned into a plurality of regions, and coupled to connectors via which a signal is input and output.

Here, the housing may include a plurality of partitions configured to partition the cavity, which is perforated in a predetermined size, into a plurality of regions; an input connector configured to receive a signal from the outside; and an output connector configured to output a signal filtered through the resonator to the outside.

Also, a wall surface of the cavity of the housing may be plated with silver (Ag) or copper (Cu).

The housing may further include an input coupling disk coupled to the input connector to transmit a signal received via the input connector to the resonator, and disposed apart by a predetermined distance from the resonator; and an output coupling disk configured to transmit a signal output from the resonator to the output connector, and disposed apart by a predetermined distance from the resonator.

The housing may further include a power feed loop coupled to the input connector and the output connector, and configured to transmit a signal received via the input connector to the resonator and transmit a signal output from the resonator to the output connector.

The filter may further include a coupling bar configured to be inserted into the cavity while passing through the housing and to adjust an amount of coupling of the resonator.

The filter may further include a cover coupled to the housing and configured to close an open surface of the housing.

The filter may further include a tuning screw coupled to the cover and configured to be inserted into the through-hole of the resonator to adjust a resonant frequency.

The present invention provides a resonator configured to improve attenuation characteristics and band stop characteristics, and a filter including the resonator.

DETAILED DESCRIPTION OF EMBODIMENTS

Figure 1:
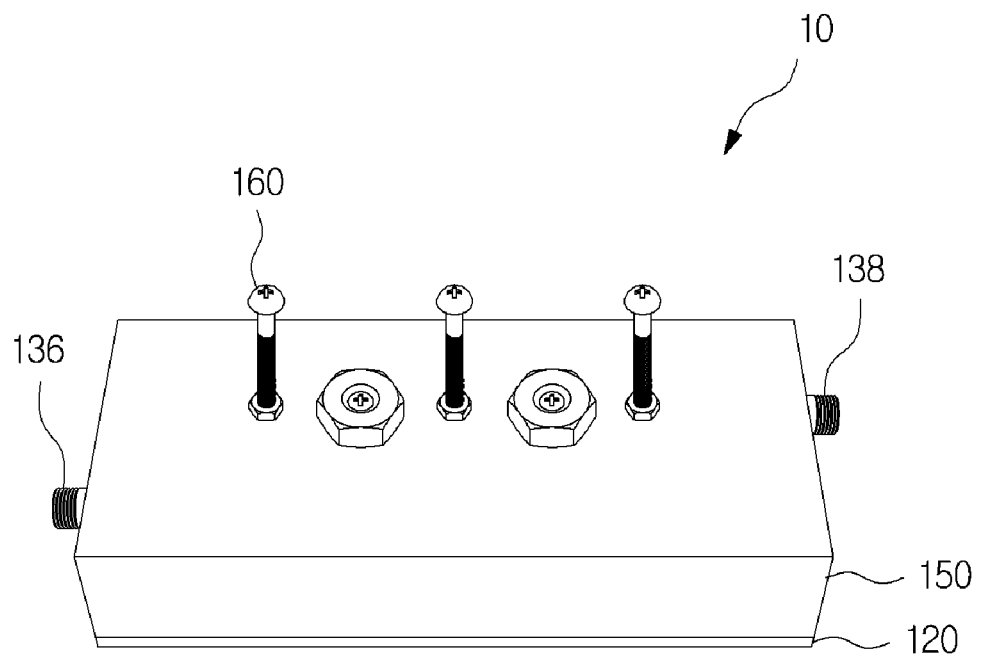
FIG. 1 is a diagram illustrating a filter according to an embodiment of the present invention.

The present invention may be embodied in many different forms and accomplished in various embodiments. Thus, exemplary embodiments of the present invention will be illustrated in the drawings and described in the detailed description in detail. However, the present invention is not limited to the embodiments set forth herein and should be construed to cover all modifications, equivalents, and alternatives falling within the scope of the invention. In the following description, well-known functions or constructions are not described in detail if it is determined that they would obscure the invention due to unnecessary detail.

It will be understood that, although the terms 'first,' 'second,' 'third,' etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section.

The terminology used herein is for the purpose of describing particular embodiments only and is not intended to be limiting of the invention. As used herein, the singular forms 'a,' 'an,' and 'the' are intended to include the plural forms as well, unless the context clearly indicates otherwise. It will be further understood that the terms 'comprises' and/or 'comprising,' when used in this specification, specify the presence of stated features, integers, steps, operations, elements, and/or components, but do not preclude the presence or addition of one or more other features, integers, steps, operations, elements, components, and/or groups thereof.

Hereinafter, a resonator and a filter including the resonator according to embodiments of the present invention will be described in detail with reference to the accompanying drawings. The same or corresponding elements are denoted by the same reference numerals throughout the drawings and will not be redundantly described here.

FIG. 1 is a diagram illustrating a filter according to an embodiment of the present invention.

Figure 2:
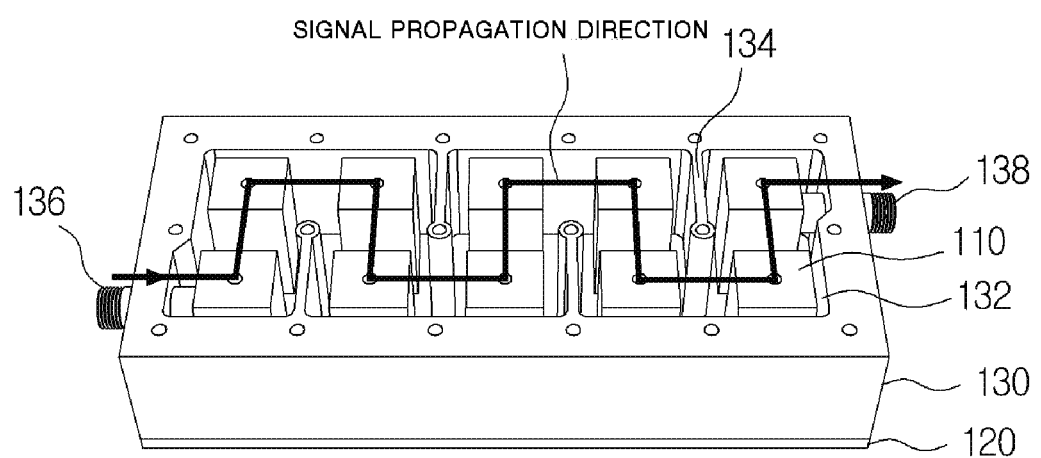
FIG. 2 is a diagram illustrating an internal structure of a filter according to an embodiment of the present invention.

FIG. 2 is a diagram illustrating an internal structure of a filter according to an embodiment of the present invention.

Referring to FIGS. 1 and 2, a filter 10 according to an embodiment of the present invention includes a resonator 110, a substrate 120, a housing 130, a cover 150, and a tuning screw 160.

First, the resonator 110 will be described in detail with reference to FIG. 3.

Figure 3:
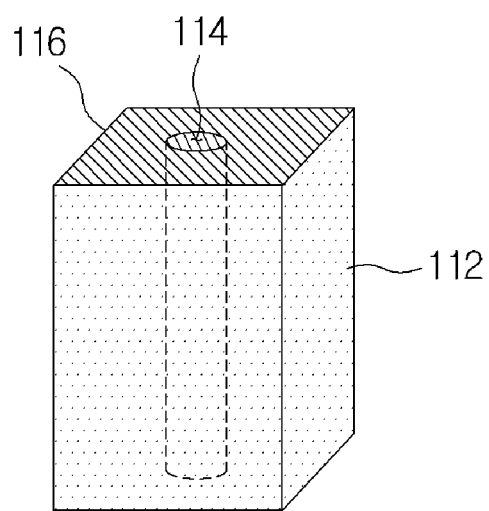
FIG. 3 is a diagram illustrating a structure of a resonator according to an embodiment of the present invention.

FIG. 3 is a diagram illustrating a structure of a resonator according to an embodiment of the present invention.

Referring to FIG. 3, the resonator 110 according to an embodiment of the present invention includes a body 112, a through-hole 114, and a conductive film 116.

The body 112 may be formed of a mixture or a compound of at least one material selected from a dielectric material group including ceramic. The body 112 may be formed such that a cross-section cut in one direction has a shape selected among a round shape, an oval shape, and a polygonal shape. Also, the body 112 may extend in a direction perpendicular to the cut cross-section. For example, the body 112 may be formed in a cylindrical shape, a cylindroidal shape, or a rectangular parallelepiped shape. The body 112 may include the through-hole 114 formed to pass through the body 112.

The through-hole 114 may be formed in a lengthwise direction of the body 112. Here, the through-hole 114 may be formed in a predetermined diameter. For example, the through-hole 114 may be formed in a diameter such that the tuning screw 160 may be inserted into the through-hole 114. Also, the through-hole 114 may be formed in a length corresponding to $\lambda/4$ of a resonant frequency. However, the length of the through-hole 114 may vary when the body 112 is formed of ceramic having a high dielectric constant.

The conductive film 116 may be coupled to at least one of both cross-sections of the body 112 in the lengthwise direction. Also, the conductive film 116 may be coupled to a wall surface of the through-hole 114. Here, the conductive film 116 may be formed of a conductive material such as a metal. Also, the body 112 may be plated with the conductive film 116.

The substrate 120 will be described in detail with reference to FIG. 4 below.

Figure 4:
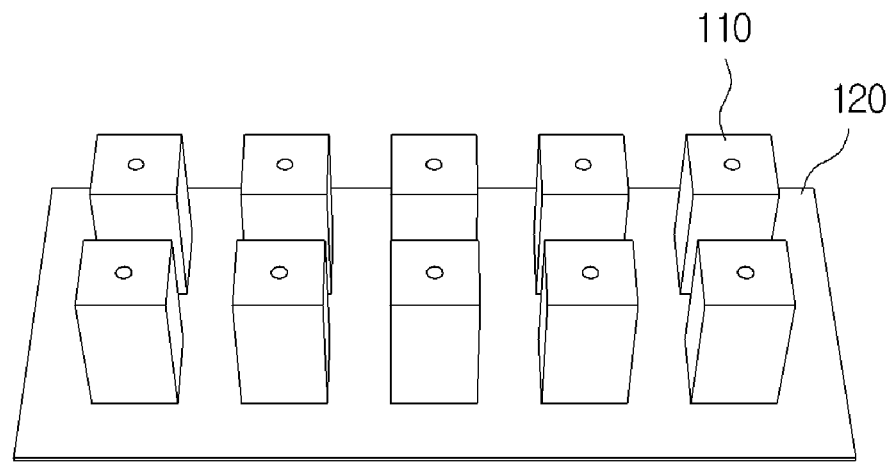
FIG. 4 is a diagram illustrating a structure in which a resonator is mounted on a substrate according to an embodiment of the present invention.

FIG. 4 is a diagram illustrating a structure in which a resonator is mounted on a substrate according to an embodiment of the present invention.

Referring to FIG. 4, at least one resonator 110 is mounted on a surface of the substrate 120. In this case, the at least one resonator 110 may be mounted on a predetermined location on the substrate 120 so that the at least one resonator 110 may be accommodated in a cavity 132 of the housing 130. Also, the substrate 120 may be electrically connected to the at least one resonator 110. The substrate 120 may perform a grounding operation. For example, the substrate 120 may be a printed circuit board (PCB) including a conductive pattern (including an electrode) for ground connection.

Here, the number of the at least one resonator 110 mounted on the substrate 120 may vary according to a frequency band predetermined for signal filtering.

The housing 130 will be described in detail with reference to FIGS. 2 and 5 below.

Figure 5:
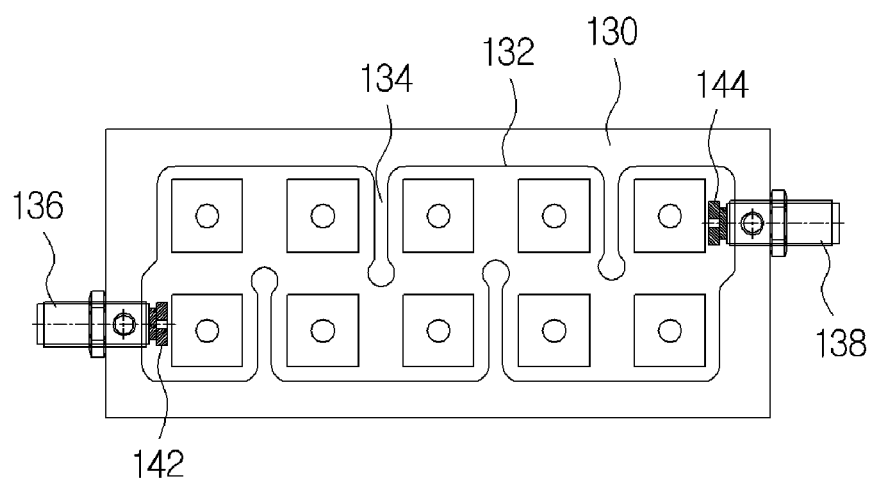
FIG. 5 is a plan view of a housing according to an embodiment of the present invention.

FIG. 5 is a plan view of a housing according to an embodiment of the present invention.

Referring to FIGS. 2 and 5, the housing 130 may be formed in a hexahedral metal box shape and include the cavity 132 that is perforated in a predetermined size. Although FIG. 2 illustrates the box type housing 130, the present invention is not limited thereto and the housing 130 may be formed in other various shapes as needed.

Surfaces of the housing 130 may be plated with a conductive material. For example, wall surfaces of the cavity 132 in the housing 130 may be plated with silver (Ag) or copper (Cu).

Also, the housing 130 may be combined with the substrate 120 below the housing 130 to accommodate the at least one resonator 110 in the cavity 132 partitioned into a plurality of regions. Here, the cavity 132 may be partitioned by a plurality of partitions 134. The plurality of partitions 134 may be formed to be spaced apart by a predetermined distance from sidewalls of the housing 130 such that the plurality of regions in the cavity 132 are connected to one another. The plurality of partitions 134 may be disposed in a zigzag pattern to partition the cavity 132 into the plurality of regions. That is, the plurality of partitions 134 may protrude from one side wall of the housing 130 toward another side wall of the housing 130 or protrude from the other side wall of the housing toward the one side wall thereof. Each of the plurality of regions of the cavity 132 may be formed in a predetermined size to adjust the amount of coupling between the at least one resonator 110 accommodated therein.

Also, the housing 130 may include an input connector 136 and an output connector 138 coupled to one side and another side thereof, respectively. A radio signal may be input to the input connector 136 via an antenna (not shown). Also, a signal filtered with a predetermined frequency band may be output from the output connector 138.

Figure 6:
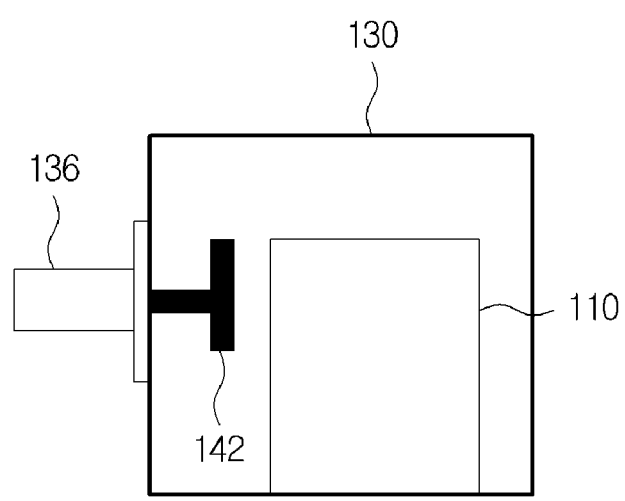
FIG. 6 is a diagram illustrating a combined structure of an input connector and a resonator included in a filter according to an embodiment of the present invention.

Also, as illustrated in FIG. 6, the housing 130 may include an input coupling disk 142 coupled to the input connector 136 to transmit a signal received from the input connector 136 to a first resonator 110 among the at least one resonator 110, and an output coupling disk 144 configured to transmit a signal received from a last resonator 110 among the at least one resonator 110 to the output connector 138. The input coupling disk 142 and the output coupling disk 144 may be coupled to the input connector 136 and the output connector 138 in the cavity 132 of the housing 130, respectively, and spaced apart from the first resonator 110 and the last resonator 110, respectively. Thus, each of the input coupling disk 142 and the output coupling disk 144 may induce electromagnetic waves input/output to pass signals of a desired frequency band in a signal propagation direction illustrated in FIG. 2.

Figure 7:
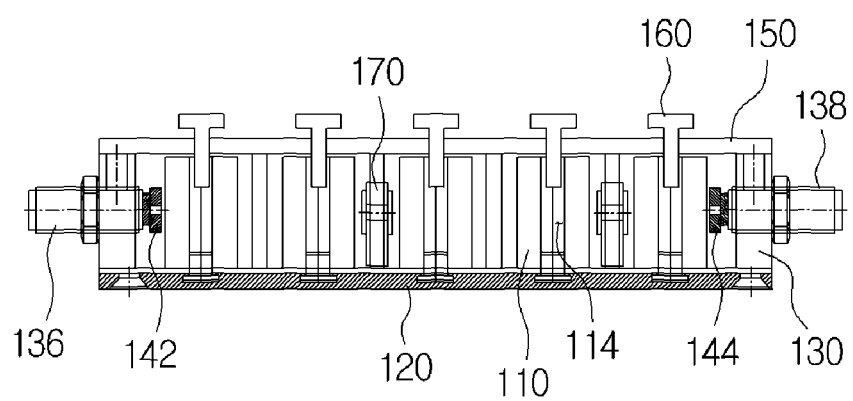
FIG. 7 is a diagram illustrating a structure of a coupling bar of a filter according to an embodiment of the present invention.

As illustrated in FIG. 7, the housing 130 may further include a coupling bar 170 configured to be inserted into the cavity 132 while passing through the housing 130 so as to adjust the amount of coupling.

The coupling bar 170 may be installed at a predetermined partition 134 among the plurality of partitions 134 partitioning the cavity 132 of the housing 130 to adjust the amount of coupling between a plurality of resonators 110, thereby suppressing generation of undesired waves.

The cover 150 is coupled to a top of the housing 130 to close an open surface of the housing 130. The cover 150 may be formed of a conductive material. Also, the cover 150 may support the tuning screw 160 installed to control a resonant frequency.

The tuning screw 160 may be combined with the cover 150 above the resonator 110 to adjust a resonant frequency. Here, the tuning screw 160 may include a tuning plate and a screw enabling the tuning plate to be moved vertically. The tuning screw 160 may be fixed on the cover 150 while being supported by a nut.

In a filter according to an embodiment of the present invention, the at least one resonator 110 having a cylindrical shape is accommodated in the cavity 132 having a square shape and the input coupling disk 142, the at least one resonator 110, and the tuning screw 160 are arranged in series. Thus, the filter is capable of filtering an input signal using the distribution of an electromagnetic field formed to have an optimum resonance point by adjusting a magnetic flux density of and the intensity of magnetization of the input signal using a capacitance C between the resonator 110 and the tuning screw 160.

Figure 8:
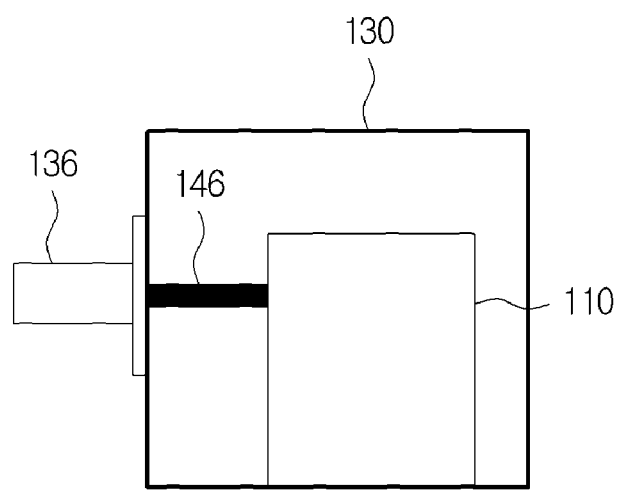
FIG. 8 is a diagram illustrating a combined structure of an input connector and a resonator included in a filter according to another embodiment of the present invention.

FIG. 8 is a diagram illustrating a combined structure of an input connector and a resonator included in a filter according to another embodiment of the present invention.

Referring to FIG. 8, in the filter according to another embodiment of the present invention, an input connector 136 and at least one resonator 110 are connected via a power feed loop 146. The power feed loop 146 is in contact with a conductive film 116 of the at least one resonator 110. The power feed loop 146 may transmit a signal received via the input connector 136 to a first resonator 110 among the at least one resonator 110. Although not shown in FIG. 8, the power feed loop 146 may connect the output connector 138 of FIG. 5 and the at least one resonator 110. The power feed loop 146 may transmit a signal output from the at least one resonator 110 to the output connector 138.

Figure 9:
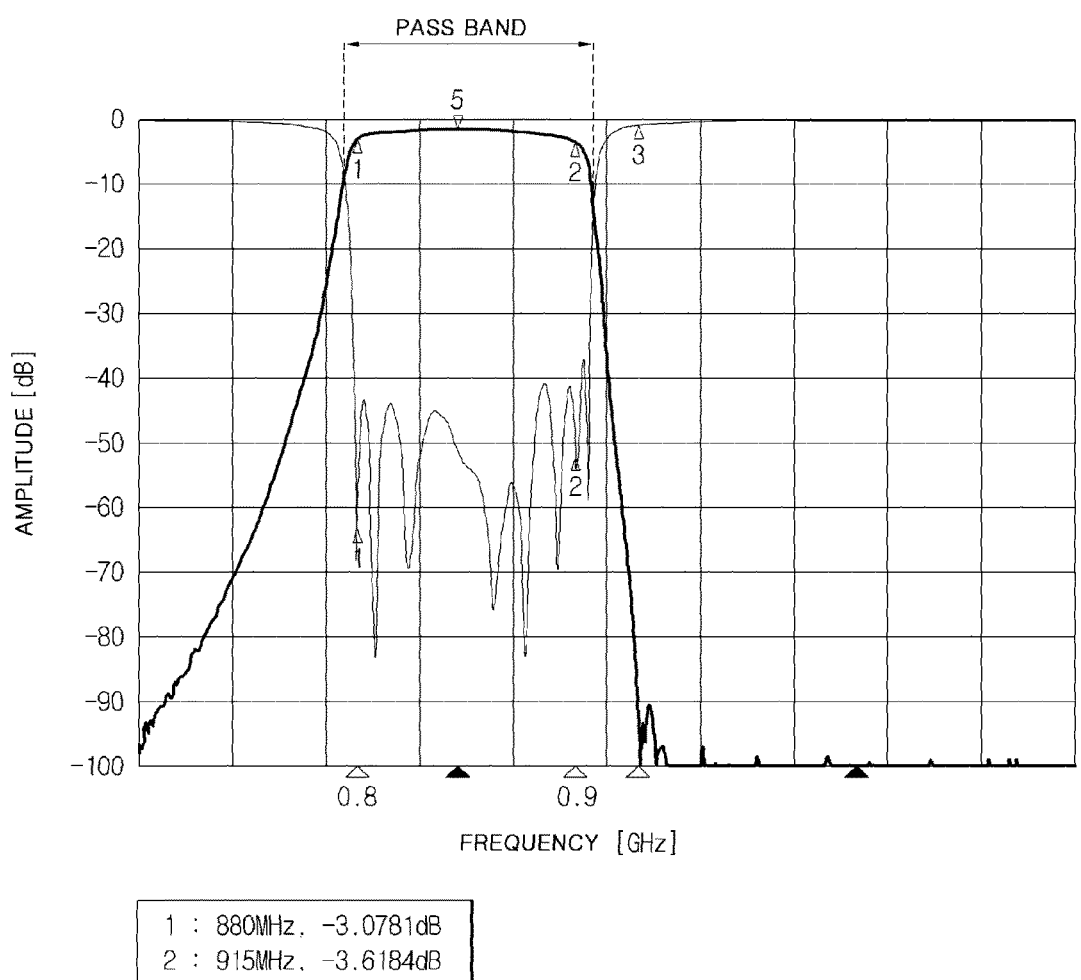
FIG. 9 is a graph illustrating band pass characteristics of a filter according to an embodiment of the present invention.

FIG. 9 is a graph illustrating band pass characteristics of a filter according to an embodiment of the present invention. FIG. 9 illustrates a result of experiment performed on a filter to which a resonator according to an embodiment of the present invention is applied.

Referring to FIG. 9, signal loss was low and signal attenuation was relatively uniform at a predetermined pass band (e.g., a pass band of 880 to 915 MHz). Furthermore, signal attention occurred to a great extent at frequency bands except for the predetermined pass band. Thus, the filter may be used as a narrow-band pass filter.

While this invention has been particularly shown and described with reference to exemplary embodiments thereof, it will be understood by those of ordinary skill in the art that various changes in form and details may be made therein without departing from the spirit and scope of the invention as defined by the appended claims.

The exemplary embodiments disclosed herein should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A resonator comprising:
    a body formed of a dielectric material and including a through-hole formed in one direction so as to penetrate the body from a top surface to a bottom surface of the body; and
    a conductive film plated on an inner surface of the through-hole and at least one of the top surface and the bottom surface of the body without being plated on a side surface of the body so that the dielectric material is exposed at the side surface of the body on which the conductive film is not plated.

2. The resonator of claim 1, wherein the body is formed of ceramic.

3. A filter comprising:
    a substrate configured to perform a grounding operation;
    a resonator according to claim 1; and
    a housing coupled to the substrate to accommodate the resonator in a cavity thereof partitioned into a plurality of regions.

4. The filter of claim 3, wherein the body of the resonator is formed of ceramic.

5. The filter of claim 3, wherein the housing comprises:
    a plurality of partitions configured to partition the cavity into a plurality of regions, wherein the cavity is perforated in a predetermined size;
    an input connector configured to receive a signal from an outside of the filter; and
    an output connector configured to output a signal filtered through the resonator to the outside.

6. The filter of claim 5, wherein a wall surface of the cavity of the housing is plated with silver (Ag) or copper (Cu).

7. The filter of claim 5, wherein the housing further comprises:
    an input coupling disk coupled to the input connector to transmit a signal received via the input connector to the resonator, and disposed apart by a predetermined distance from the resonator; and
    an output coupling disk configured to transmit a signal output from the resonator to the output connector, and disposed apart by a predetermined distance from the resonator.

8. The filter of claim 5, wherein the housing further comprises a power feed loop coupled to the input connector and the output connector, and configured to transmit a signal received via the input connector to the resonator and transmit a signal output from the resonator to the output connector.

9. The filter of claim 3, further comprising a coupling bar configured to be inserted into the cavity while passing through the housing and to adjust an amount of coupling of the resonator.

10. The filter of claim 3, further comprising a cover coupled to the housing and configured to close an open surface of the housing.

11. The filter of claim 10, further comprising a tuning screw coupled to the cover and configured to be inserted into the through-hole of the resonator to adjust a resonant frequency.

* * * * *